(12) United States Patent
Nakamura et al.

(10) Patent No.: US 7,015,578 B2
(45) Date of Patent: Mar. 21, 2006

(54) SEMICONDUCTOR UNIT WITH COOLING SYSTEM

(75) Inventors: Shigenobu Nakamura, Anjo (JP); Hiroshi Ishiyama, Chiryu (JP); Yasuyuki Sakai, Oobu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/853,247

(22) Filed: May 26, 2004

(65) Prior Publication Data

US 2005/0012206 A1   Jan. 20, 2005

(30) Foreign Application Priority Data

May 26, 2003   (JP)   ............................. 2003-148022
Dec. 19, 2003   (JP)   ............................. 2003-423099

(51) Int. Cl.
*H01L 23/34* (2006.01)

(52) U.S. Cl. ...................................... 257/713; 257/717
(58) Field of Classification Search ................ 257/713, 257/714, 723, 686, 787
See application file for complete search history.

(56) References Cited

U.S. PATENT DOCUMENTS 6,542,365 B1   4/2003   Inoue

2005/0012206 A1 *  1/2005  Nakamura et al. .......... 257/717

FOREIGN PATENT DOCUMENTS

| JP | A 2001-308263 | 11/2001 |
|----|---------------|---------|
| JP | A 2001-320005 | 11/2001 |
| JP | A 2002-095267 | 3/2002 |

* cited by examiner

*Primary Examiner*—Mark V. Prenty
(74) *Attorney, Agent, or Firm*—Oliff & Berridge, PLC (57) ABSTRACT

A semiconductor unit has semiconductor modules and cooling members. The semiconductor module includes power devices with a flat shape, the first electrode bonded to the first device surface, the second electrode bonded to the second device surface, the first terminals connecting to a device control circuit, the second terminals connecting to a device driving circuit, and mold resin unifying the devices, the first electrode, the second electrode, the first terminals, and the second terminals in a unit. The mold resin is so formed that the first electrode face and second electrode face are exposed. The cooling members sandwich the semiconductor modules through insulating members. The semiconductor unit has the first electrode face of the first electrode coplanar with the first resin face of the mold resin, and/or the second electrode face of the second electrode coplanar with the second resin face of the mold resin.

24 Claims, 7 Drawing Sheets

SEMICONDUCTOR UNIT WITH COOLING SYSTEM

BACKGROUND OF THE INVENTION

1. Technical Field of the Invention

The present invention relates to a semiconductor unit for power control mounted on a vehicle.

2. Background Art

Conventionally, vehicles such as electric vehicles and electric hybrid vehicles are configured to run by driving an onboard AC electric motor through DC to AC conversion of direct current from a battery to alternative current using an inverter. The inverter includes a plurality of semiconductor modules. Each semiconductor module has one or more semiconductor devices, a pair of electrode plates on both sides of the semiconductor devices, and connecting terminals connecting the semiconductor module to an external control circuit and a driving circuit. The semiconductor module generates heat by the semiconductor devices during operation thereof. To overcome this issue, a plurality of methods has been proposed for suppressing the heat generation (For example, Japanese Patent First Publication No. 2001-320005 and Japanese Patent First Publication No. 2002-95267).

A semiconductor unit described in the Japanese Patent First Publication No. 2001-320005 is sandwiched by a pair of cooling pipes in which a coolant flows. In addition, an insulating member and/or a soft thermally conductive material are inserted between the semiconductor module and the cooling pipe, and by applying pressure to the insulating member and the soft thermally conductive material, the cooling performance of the semiconductor module is increased.

On the other hand, as for an electronic cooling unit described in the Japanese Patent First Publication No. 2002-95267, a pair of electrode plates of a semiconductor is sandwiched by a pair of cooling pipes through a metal member or an insulating plate which has a linear expansion coefficient close to that of the semiconductor. Accordingly, an in-plane breakage of the semiconductor device and/or the insulating plate is avoided as well as an improvement of the cooling performance.

According to the semiconductor units described in the Japanese Patent First Publication No. 2001-320005 and Japanese Patent First Publication No. 2002-95267, stresses to the surface direction of a pair of electrode plates on both sides of a semiconductor device change depending on heating up and cooling down of the semiconductor module. For example, aluminum, which is a fairly thermally conductive material, is used for fabricating the cooling pipe in general. However, a liner expansion coefficient of aluminum is larger than that of the semiconductor module and ceramics, such as the insulating plate. Because the cooling pipes sandwiching the semiconductor module are fixed with a through-bolt made of, for example, steel, a stress to the semiconductor device located between the two electrode plates, which are sandwiched by the cooling pipes, is increased by heating up or cooling down of the semiconductor module thereof. As in the case of Japanese Patent First Publication No. 2001-320005, if the semiconductor module is molded, a force pushing up the electrode plate to the cooling pipe is added by a part of the mold resin because the linear expansion coefficient of the mold resin is larger than that of metal. Thus, repeating stresses to the semiconductor device, for example, by the heating up and cooling down, are increased, and as a result a lifetime of the semiconductor device is decreased.

If an initial setting of the stress to the electrode plate is lowered when a vehicle is at stop as a countermeasure to overcome the above issue, a fixing force of the semiconductor module is also lowered. In addition, an inverter unit is in a vibrational environment when the vehicle is moving, therefore a vibration of the loosely fixed semiconductor module is increased when the mold resin expansion caused by the heat generation of the semiconductor device is still small. Then, connecting terminals connecting the semiconductor module to an external control circuit and a driving circuit are distorted, thereby resulting in a short-circuit among the terminals or a breakage of the wire. An increase of rigidity and/or a setting up of a buffering-bend may be countermeasures for this issue. However, an additional manufacturing cost of the semiconductor unit may result by these.

In the case of a moldless semiconductor module, as described in the Japanese Patent First Publication No. 2002-95267, an issue of increased stress is further multiplied at joined parts (for example, a joined part with solder) between the semiconductor device and external connection terminals due to the vibration of the semiconductor module, and as a result, a decreased reliability will result.

SUMMARY OF THE INVENTION

The present invention has been made considering the above issue in the background art. It is therefore an object of the present invention to provide a low cost and high reliability semiconductor unit mounted on vehicles.

According to the first feature of the present invention, the semiconductor unit of the present invention has a semiconductor module and cooling members. The semiconductor module includes a power semiconductor device formed substantially flat, the first electrode plate bonded to one side (the first side) of the power semiconductor device, the second electrode plate bonded to the other side (the second side) of the power semiconductor device, the first connecting terminal electrically connected to a control circuit for controlling the power semiconductor device, the second connecting terminal electrically connected to a driving circuit for driving the power semiconductor device, and a mold resin unifying the power semiconductor device, the first electrode plate, the second electrode plate, the first connecting terminal, and the second connecting terminal in a unit. The mold resin is so formed that the first electrode face of the first electrode plate and the second electrode face of the second electrode plate are not covered with the mold resin. The shape of the semiconductor module is substantially planar. The cooling members sandwich the semiconductor module through insulating members. That is, the cooling members are located on both sides of the planar shaped semiconductor module.

A characteristic configuration of the present invention is to arrange the first electrode face of the first electrode plate and/or the second electrode face of the second electrode plate so that the first electrode face is coplanar with the first resin face of the mold resin, and/or the second electrode face is coplanar with the second resin face of the mold resin. To form the first electrode face coplanar with the first resin face means that the first electrode face, which is the face of the first electrode plate exposed to one side of the semiconductor module mentioned above, and the first resin face, which is the face of the mold resin mentioned above exposed to said one side of the semiconductor module, are made to be in the same plane. To form the second electrode face coplanar with the second resin face means that the second electrode face, which is the face of the second electrode plate exposed to the other side of the semiconductor module mentioned above, and the second resin face, which is the face of the mold resin mentioned above exposed to said the other side of the semiconductor module, are made to be in the same plane.

The mold resin, which has the largest linear expansion coefficient among all the members composing the semiconductor module, expands to a direction that may produce a stress to the semiconductor module when heat is generated in the semiconductor device. But the stress is absorbed by the expanded mold resin. Therefore the first electrode plate, the second electrode plate, and the semiconductor device bonded to the electrode plates do not directly receive the stress. As a result, a lifetime of the semiconductor device is prevented from degradation caused by repeated stresses. In addition, a reliable fixing of the semiconductor module is achieved. Of course, there is no additional cost due to anti-vibration countermeasures such as an increase of rigidity or more complicated structure. By making the first electrode face coplanar with the first resin face, or the second electrode face coplanar with the second resin face, the advantages described in the above over the prior art are achieved. If both of the arrangements are implemented, that is, if the first electrode face is coplanar with the first resin face and the second electrode face is also coplanar with the second resin face, the more advantages should result.

According to the second feature of the present invention, the first resin face of the mold resin is configured to protrude from the first electrode face of the first electrode plate, and/or the second resin face of the mold resin is configured to protrude from the second electrode face of the second electrode plate when the semiconductor device is in operation, as a result an effectiveness of the advantages are assured.

According to the third feature of the present invention, the mold resin is particularly configured to surround all perimeter of the first electrode face of the first electrode plate and/or the second electrode face of the second electrode plate, accordingly the semiconductor module is securely fixed by the expanded mold resin with a larger stressing area when the semiconductor device is generating heat by operation.

According to the fourth feature of the present invention, a thermally conductive material is pasted on, at least to the first electrode face of the first electrode plate, and also the first groove is formed on the mold resin at both of the first connecting terminal side and the second connecting terminal side of at least the first electrode face of the first electrode plate. In general, a thermal grease (that is, a thermally conductive material) is filled between the electrode and the insulating member for increasing thermal conduction. The thermal grease is, for example, a silver particle paste, which is an electrically conductive material and has a superior thermal dissipation characteristic to zinc oxide or alumina particles since an electrically conductive material has a high thermal conductivity. However, an electrically conductive material is not used for the thermal grease in general by the following reasons. The insulating member is pressed to the semiconductor module to decrease the thickness of the grease as thin as possible for reducing thermal resistance of the grease. Therefore, the grease is pushed out around the electrode plate. Then, if an electrically conductive thermal grease is used, a short-circuit may result between the electrode plates and the connecting terminals of the semiconductor module through the thermal grease. Even if the grease does not contact to the connecting terminals of the semiconductor module, a short-circuit may also occur when the distance between the leaked grease and the connecting terminals is small, that is, when a creepage distance of insulation is not enough, by gradually forming a conductive path, so called "tacking", on the surface of the semiconductor module by application of a high voltage.

However, since the first groove is formed on the first resin face of the mold resin according to the present invention, the thermally conductive material pasted on the first electrode plate is prevented from leaking out to the first connecting terminal and the second connecting terminal. This is because the thermally conductive material pasted on the first electrode plate, then, leaked out therefrom stays in the first groove. For example, if the first connecting terminal and the second connecting terminal are extended to the same direction, at least the first groove should be formed between the first electrode face of the first electrode plate and the first and the second connecting terminals. On the other hand, if the first connecting terminal and the second connecting terminal are extended to the opposite directions to each other regarding the first electrode plate, at least the first groove should be formed between the first electrode plate and the first connecting terminal, and also between the first electrode plate and the second connecting terminal. In this case, the first groove is divided into two separate grooves substantially parallel to each other and coplanar with the first electrode face. The first groove is not limited to a straight shape. A curved groove is also possible.

According to the fifth feature of the present invention, furthermore, a thermally conductive material is pasted on at least to the second electrode face of the second electrode plate, and also the second groove is formed on the mold resin at least on both of the first connecting terminal side and at the second connecting terminal side of the second electrode face of the second electrode plate. By the second groove, the thermally conductive material pasted on the second electrode plate is prevented from leaking out to the first connecting terminal and the second connecting terminal just the same way as the first groove. This is because the thermally conductive material pasted on the second electrode plate, then, leaked out therefrom stays in the second groove. For example, if the first connecting terminal and the second connecting terminal are extended to the same direction, the second groove should be formed at least between the second electrode face of the second electrode plate and the first and the second connecting terminals. On the other hand, if the first connecting terminal and the second connecting terminal are extended to the opposite directions to each other regarding the second electrode plate, the second groove should be formed at least between the second electrode plate and the first connecting terminal, and between the second electrode plate and the second connecting terminal. In this case, the second groove is divided into two separate grooves substantially parallel to each other and coplanar with the second electrode face. The second groove is not limited to a straight shape. A curved groove is also possible.

According to the sixth feature of the present invention, the first groove is characterized by being formed to surround the whole perimeter of the first electrode face of the first electrode plate. With this feature, the thermally conductive material is prevented from leaking out to the outside of the first groove on the first resin face of the mold resin. As a result, the thermally conductive material pasted on the first electrode face is prevented from leaking out to the first connecting terminal and the second connecting terminal to cause failure.

In addition, according to the seventh feature of the present invention, the second groove is characterized by being configured to surround the whole perimeter of the second electrode face of the second electrode plate. With this feature, the thermally conductive material is prevented from leaking out to the outside of the second groove on the second resin face of the mold resin. Accordingly, the thermally conductive material pasted on the second electrode face is prevented from leaking out to the first connecting terminal and the second connecting terminal to cause failure.

According to the eighth feature of the present invention, the thermally conductive material is characterized by being made of an electrically conductive material. As described in the above, it has been difficult to use an electrically conductive material for a thermally conductive material. However, even if the thermally conductive material made of an electrically conductive material is pasted on the first electrode face of the first electrode plate, a short-circuit between the first electrode plate and the electrode terminals is avoided when the first groove is formed on the first resin face. Also, even if the thermally conductive material made of an electrically conductive material is pasted on the second electrode face of the second electrode plate, a short-circuit between the second electrode plate and the electrode terminals is prevented when the second groove is formed on the second resin face. Therefore, a more thermally conductive material than before made of an electrically conductive material can be used as described. Thus, an effective thermal dissipation of a semiconductor module is achieved.

According to the ninth feature of the present invention, the first module surface and the second module surface of the semiconductor module (both sides of planar surfaces of a planar shaped semiconductor module) are characterized by being substantially parallel to each other. As a result, it assures a sufficient stressing area facing to the pair of cooling members that are arranged to face to both of the planar surfaces of the semiconductor module. Then, sufficient fixing of the semiconductor module is achieved. The words "substantially parallel" in the above means that the parallelism between the two planar surfaces of the semiconductor module is kept within 0.4 mm. A parallelism below 0.2 mm is desirable. A parallelism below 0.1 mm can drastically reduce the stress. The parallelism is defined by two parallel planes with a specified distance apart and parallel to a datum plane within which the line element of the surface of the considered feature must lie. (JIS B0021: 1998, ISO/DIS1101-1:96IDT). Therefore, if a line element of a surface lies between two imaginary planes with L mm distance apart and parallel to a datum, or the ideal plane, the parallelism of the surface is L mm.

According to the tenth feature of the present invention, the semiconductor unit includes a plurality of the semiconductor modules of substantially the same thicknesses defined between said first module surface and said second module surface (i.e. the distances between said two planar surfaces), and are sandwiched by a pair of the cooling members. With the above configuration, a sufficient stressing area between the plurality of semiconductor modules and the cooling members is assured. Then, a sufficient fixing of the plurality of semiconductor modules is achieved. The words "substantially the same thicknesses" in the above indicates, for example, that a thickness error of each semiconductor module from the average value of the plurality of semiconductor modules is within ±2%. Writing an actual number, below ±0.05 mm is desirable for the thickness tolerance.

According to the eleventh feature of the present invention, the semiconductor unit is characterized by being configured that the semiconductor unit includes a plurality of semiconductor modules driving the same phase, and that the mold resin unifies the power semiconductor devices, the first electrode plate, the second electrode plate, the first connecting terminal, and the second connecting terminal in a unit. As a result, the manufacturing process can be simplified while a sufficient fixing is achieved, resulting in manufacturing cost reduction.

According to the twelfth feature of the present invention, the cooling member is characterized by a cooling pipe having flow paths in which a coolant flows. Therefore, a temperature rise of the semiconductor module is suppressed, resulting in an extended lifetime of the semiconductor device.

According to the thirteenth feature of the present invention, the cooling member is also characterized by being made of aluminum. Therefore, an effective cooling of the semiconductor module is achieved.

According to the fourteenth feature of the present invention, the semiconductor unit is characterized by being configured that the semiconductor unit includes a plurality of semiconductor modules and a plurality of cooling members, and that the semiconductor module and the cooling member are stacked one after the other. Accordingly, a cooling of the semiconductor module is effectively carried out, and a fixing reliability of the semiconductor module is secured. In addition, for instance, since an effective heat absorption is implemented with both surfaces of the cooling member, the number of the components of the semiconductor unit can be reduced, thereby resulting in manufacturing cost reduction.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but is for the purpose of explanation and understanding only.

In the drawings.

DESCRIPTION OF THE PREFERRED EMBODIMENTS (First Embodiment)

Figure 1:
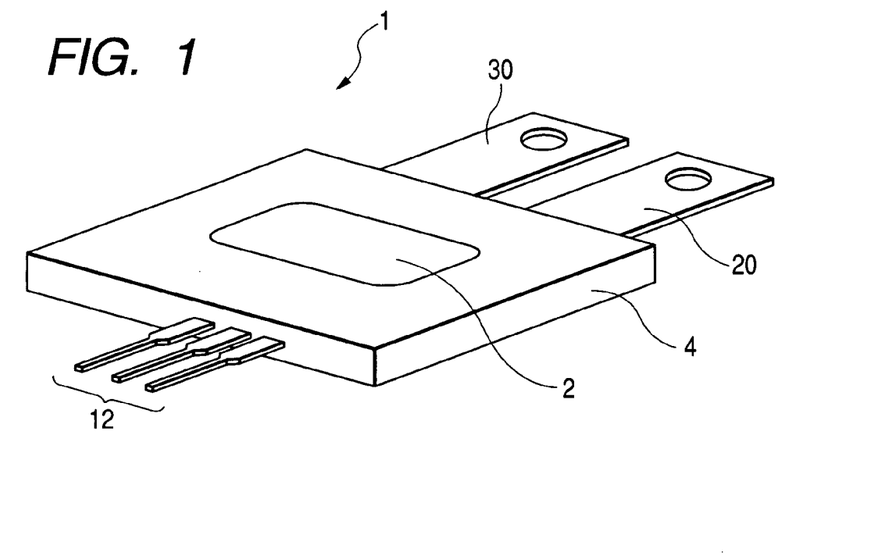
FIG. 1 is a perspective view of a semiconductor module of the first embodiment.
Figure 2:
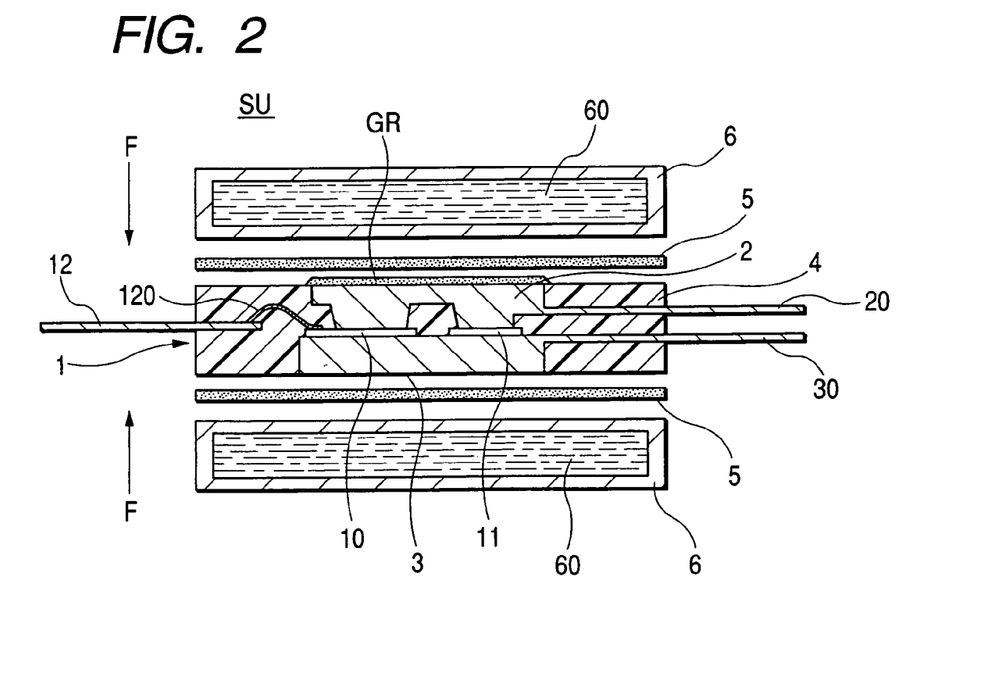
FIG. 2 is a cross sectional view of a semiconductor unit of the first embodiment.
Figure 3:
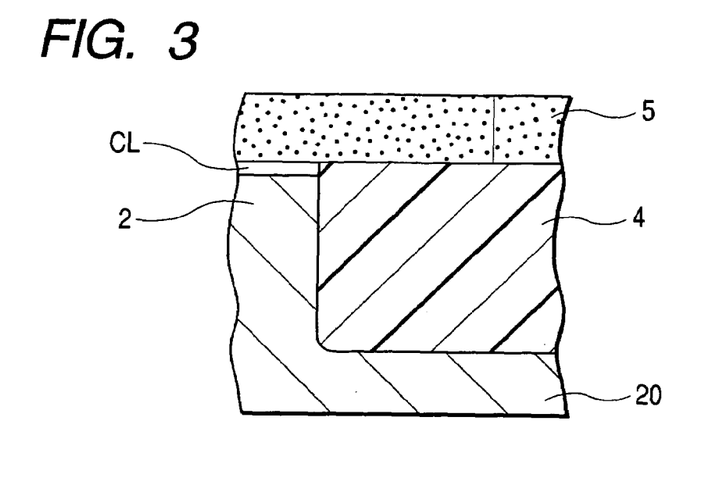
FIG. 3 is a partial cross sectional view of a semi conductor module of the first embodiment at heat generation by operation.

Referring to FIG. 1 to FIG. 3, the first embodiment of the present invention is described below.

An arrangement of a semiconductor unit SU of the first embodiment is described by referring to FIG. 1 and FIG. 2. FIG. 1 is a perspective view of a semiconductor module to be placed in the semiconductor unit SU in the first embodiment. FIG. 2 shows a cross sectional view of the semiconductor unit SU of the first embodiment.

As shown in FIG. 1 and FIG. 2, the semiconductor unit SU includes the semiconductor module 1, insulating members 5, and cooling pipes (cooling members) 6. The semiconductor module 1 has semiconductor devices and electrode plates which support the semiconductor devices. The semiconductor devices include the fit semiconductor device 10 and the second semiconductor device 11. The electrode plates have a pair of electrode plates 2 and 3 which sandwich the semiconductor devices. Specifically, the semiconductor module 1 includes the first semiconductor device 10, the second semiconductor device 11, an upper electrode plate 2 (the first electrode plate), a lower electrode plate 3 (the second electrode plate), an upper driving electrode terminal 20 (the first connection terminal), a lower driving electrode terminal 30 (the second connection terminal), control electrode terminals 12 (the first connection terminal), bonding wires 120, and a mold resin 4. The semiconductor module 1 has a substantially planar shape as a whole.

The first semiconductor device 10 is, for example, a high power IGBT. The second semiconductor device 11 is, for example, a flywheel diode. The upper electrode plate 2 is an electrode plate bonded to the upper side of the first semiconductor device 10 and the second semiconductor device 11 with, for example, solder. The lower electrode plate 3 is an electrode plate bonded to the lower side of the first semiconductor device 10 and the second semiconductor device 11 with, for example, solder. The upper driving electrode terminal 20, which extends from the upper electrode plate 2, is a terminal electrically connected to a driving circuit for driving the first semiconductor device 10 and the second semiconductor device 11. The lower driving electrode terminal 30, which extends from the lower electrode plate 3, is also a terminal electrically connected to a driving circuit for driving the first semiconductor device 10 and the second semiconductor device 11. The control electrode terminals 12 are terminals electrically connected to a control circuit (not shown) for controlling the first semiconductor device 10. The bonding wires 120 are signal lines electrically connecting the first semiconductor device 10 and the control electrode terminals 12. The mold resin 4 unifies the first semiconductor device 10, the second semiconductor device 11, the upper electrode plate 2, the lower electrode plate 3, the upper driving electrode terminal 20, the lower driving electrode terminal 30, the control electrode terminals 12, and the bonding wires 120 in a unit. However, the first electrode surface (the upper face) of the upper electrode plate 2 and the second electrode surface (the lower face) of the lower electrode plate 3 are exposed.

As shown in FIG. 2, the upper planar surface of the planar semiconductor module 1 (the upper planar surface or the first module surface) includes the first exposed electrode face of the upper electrode plate 2 and the first resin face of the mold resin 4 which surrounds the upper electrode 2. The upper exposed face of the upper electrode plate 2 is configured to be substantially coplanar with the upper resin face of the mold resin 4 in the fabrication process of the semiconductor module 1. On the other hand, the lower planar surface of the planar semiconductor module 1 (a planar surface on the lower side, that is, the second module surface) includes lower exposed face (the second electrode face) of the lower electrode plate 3 and lower resin face (the second resin face) of the mold resin 4 which surrounds and encloses the lower electrode plate 3. The lower exposed face of the lower electrode plate 3 is configured to be substantially coplanar with the lower resin face of the mold resin 4 in the fabrication process of the semiconductor module 1. To make the upper exposed face of the upper electrode plate 2 to be substantially coplanar with the upper resin face of the mold resin 4, and the lower exposed face of the lower electrode plate 3 to be substantially coplanar with the lower resin face of the mold resin 4, it is achievable either by a precisely adjusted molding die only or by cutting away excess resin after molding.

In both of the parallel surfaces of the semiconductor 1, the mold resin 4 is present at least on two opposite sides of the semiconductor device and the electrode. In this embodiment, the mold resin 4 is formed as to wholly surround the perimeter of the semiconductors 10 and 11 and electrode plates 2 and 3. That is, the mold resin 4 is present on the left, right, front and back sides of the semiconductors 10 and 11 and electrode plates 2 and 3. A plurality of control electrode terminals 12 and the driving electrode terminals 20 and 30 are distributed on the periphery of the semiconductor module 1. In this embodiment, a plurality of terminals are distributed on both of the left and right sides or on both of the front and back sides of the semiconductor module 1. Specifically, both of the upper driving electrode terminal 20 and the lower driving electrode terminal 30 are arranged to extend to one side of the semiconductor module 1. On the other hand, the control electrode terminals 12 are set up to extend to the other side of the semiconductor module 1. That is, the extending direction of the two driving electrode terminals 20 and 30 is opposite to the direction of the control electrode terminals 12.

A pair of the insulating members 5 are arranged to face the upper planar surface (the first module surface) and the lower planar surface (the second module surface) of the semiconductor module 1. That is, the semiconductor module 1 is sandwiched by the pair of insulating members 5. The insulating member 5 is a plate or film made of, for example, aluminum nitride or silicon nitride.

A small amount of thermal grease GR (a thermally conductive material) is applied on the upper exposed face of the upper electrode plate 2 and the lower exposed face of the lower electrode plate 3. Heat dissipation is improved by the thermal grease GR. For example, electrically nonconductive zinc oxide and/or alumina particles are used for the material of the thermal grease GR. The reason for using an electrically nonconductive material is described below. If an electrically conductive grease is used, and if the grease leaks out of the gap between the semiconductor module 1 and the insulating member 5, a short-circuit may result between at least one of the upper and the lower electrode plates 2 and 3, and at least one of the upper driving electrode terminal 20, the lower driving electrode terminal 30, and the control electrode terminals 12. Therefore, to avoid the short-circuit, a nonconductive material is employed for the thermal grease GR.

A pair of cooling pipes 6 are arranged to face the upper planar surface (the first module surface) and the lower planar surface (the second module surface) of the semiconductor module 1 through the intermediates of the insulating members 5. That is, the semiconductor module 1 and the insulating members 5 are sandwiched by the pair of cooling pipes 6. The cooling pipe 6 has cooling flow paths 60 through which a coolant, for example, water flows. The cooling pipe 6 is made of metallic material having a good thermal conductivity such as aluminum.

FIG. 2 is an exploded cross sectional view of the semiconductor unit SU in this embodiment. It shows cross sections of the semiconductor module 1, the pair of insulating members 5, and the pair of cooling pipes 6. As shown, the insulating members 5 are placed on both sides of the surface of the semiconductor module 1. The insulating member 5 closely contacts the surface of the semiconductor module 1. A thermal grease GR may be applied on the surface between the semiconductor module 1 and the insulating member 5. In addition, the upper cooling pipe 6 closely contacts the upper surface of the upper insulating member 5. The lower cooling pipe 6 also closely contacts the lower surface of the lower insulating member 5. The pair of the cooling pipes 6 can be fixed in advance by using, for example, bolts with a predetermined space between the two cooling pipes 6. The space formed by the pair of cooling pipes 6 has a height and an area for including the pair of insulating members 5 and the semiconductor module 1 therein. The space between the pair of the cooling pipes 6 is so configured that the pair of the cooling pipes 6, the pair of the insulating members 5, and the semiconductor module 1 closely contact each other. In FIG. 2, the pair of insulating members 5 and the semiconductor module 1 are sandwiched and fixed with a constant pressure by the pair of cooling pipes 6. In FIG. 2, a pair of arrows F show the directions of the stress force by the pair of cooling pipes 6.

Next, the operation of the semiconductor unit SU arranged as the above is described below, when the first semiconductor device 10 and the second semiconductor device 11 are generating heat. FIG. 3 shows a partial cross sectional view of the semiconductor module 1 when the semiconductor module 1 is generating heat.

As shown in FIG. 2, the upper exposed face of the upper electrode plate 2 and the upper resin face of the mold resin 4 are configured substantially coplanar to each other, and the lower exposed face of the lower electrode plate 3 and the lower resin face of the mold resin 4 are also formed substantially coplanar to each other in the fabrication process of the semiconductor module 1. If the first semiconductor device 10 and the second semiconductor device 11 are generating heat, the heat is carried to the upper electrode plate 2, the lower electrode plate 3, and the mold resin 4. The linear expansion coefficient of the mold resin 4 is larger than that of the electrode plates 2 and 3. Therefore, as shown in FIG. 3, the mold resin 4 expands more than much, compared with the electrode plates 2 and 3, to the direction of the thickness (the direction perpendicular to the surface of the semiconductor module 1 in FIG. 2) of the semiconductor module 1. The heat of the semiconductor devices 10 and 11 is then transferred to the cooling pipes 6, made of aluminum, through the upper electrode plate 2, the lower electrode plate 3, and the mold resin 4. As a result, the cooling pipes 6 are also expanded.

When the semiconductor module 1 is in operation, the generated heat causes expansion of the semiconductor module 1 and the cooling pipes 6 resulting in a stressing force which is absorbed by the expanded mold resin 4 of the semiconductor module 1. As a result, the upper electrode plate 2 and the lower electrode plate 3 are substantially stress free. Thereby, the first semiconductor device 10 and the second semiconductor device 11, which are directly bonded to the electrode plates 2 and 3, are also substantially stress free. Accordingly, the first semiconductor device 10 and the second semiconductor device 11 are prevented from degradation due to the repeated stresses caused by heat generation of themselves, and a sufficient fixing of the semiconductor module 1 is also achieved. Furthermore, there is no additional cost for anti-vibration countermeasures such as increased rigidity or more complicated structure. If parallelism of the two planar surfaces of the semiconductor module 1 is improved, the resistance to vibration is further improved since a sufficient stressing area is secured when the mold resin 4 is expanded.

Figure 4:
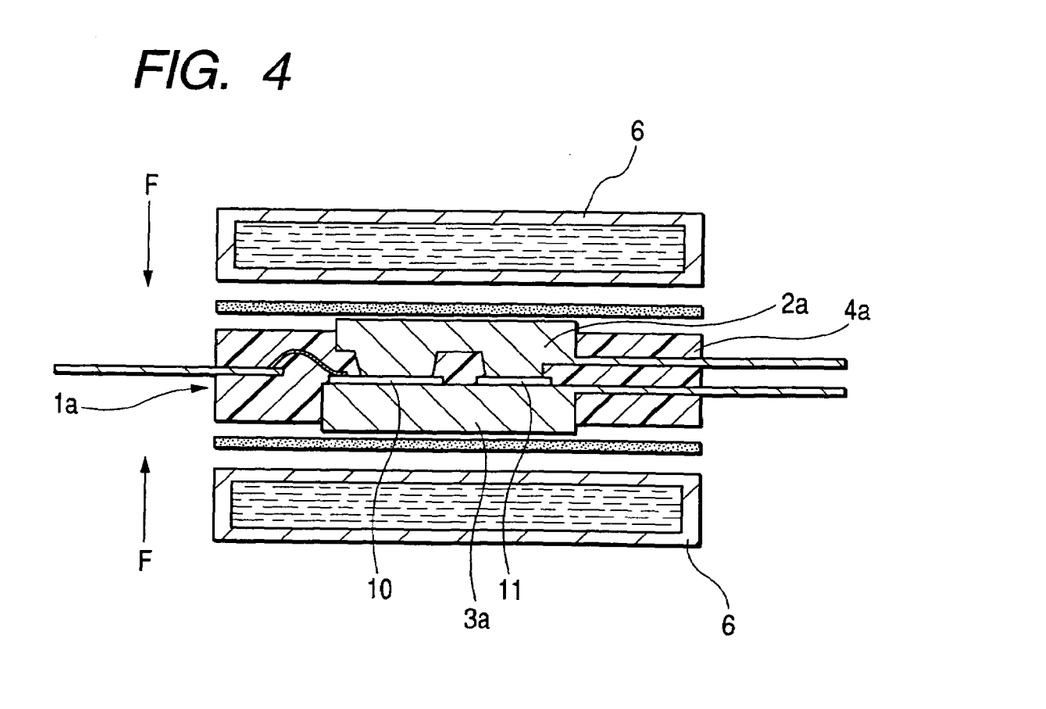
FIG. 4 is a cross sectional view of a semiconductor unit of the background art.

For reference, a semiconductor unit of a related art is described herein below. FIG. 4 shows a cross sectional view of the related semiconductor unit. A member common to the present invention has the same numeral as in the present invention.

A semiconductor module 1a includes the first semiconductor device 10, the second semiconductor device 11, an upper electrode plate 2a, a lower electrode plate 3a, an upper driving electrode terminal 20, a lower driving electrode terminal 30, control electrode terminals 12, bonding wires 120, and a mold resin 4a. The semiconductor module 1a has a substantially planar shape as a whole. An exposed face of the upper electrode plate 2a is not coplanar with a resin face of the upper mold resin 4a, but protrudes upwards a little from the resin face of the upper mold resin 4a. Also, an exposed face of the lower electrode plate 3a is not coplanar with a resin face of the lower mold resin 4a, but protrudes downwards a little from the resin face of the lower mold resin 4a.

Hereinbelow, behaviors of the semiconductor devices 10 and 11 are described when the semiconductor unit configured as the above is in operation, and thereby generating heat. The semiconductor module 1a by the heat of the semiconductor devices 10 and 11. The aluminum cooling pipes 6 also expand. A stressing force originated from the expansion is directly applied on the upper electrode plate 2a and the lower electrode plate 3a. Then, the force is applied on the semiconductor devices 10 and 11, which are sandwiched between the upper electrode plate 2a and the lower electrode plate 3a. In other words, the mold resin 4 does not absorb the stresses, unlike the present invention in which the mold resin 4 does absorb the stresses. As a result, in the related art, lifetimes of the semiconductor devices 10 and 11 have been degraded by the repeated stresses originated from heating up and cooling down of the semiconductor devices 10 and 11.

On the contrary, in the first embodiment, when the semiconductor module 1 is in operation, the generated heat causes expansion of both the semiconductor module 1 and the cooling pipes 6 resulting in a stressing force, which is absorbed by the expanded mold resin 4 of the semiconductor module 1. As a result, the upper and lower electrode plates 2 and 3 are substantially stress free, resulting in also stress free of the first and second semiconductor devices 10 and 11. Accordingly, the first and second semiconductor devices 10 and 11 are prevented from degradation due to the repeated stresses caused by the heat generation of themselves, and a sufficient fixing of the semiconductor module 1 is also achieved. It is therefore possible to provide a low cost and high reliability semiconductor unit mounted on vehicles.

(Second Embodiment)

Figure 5:
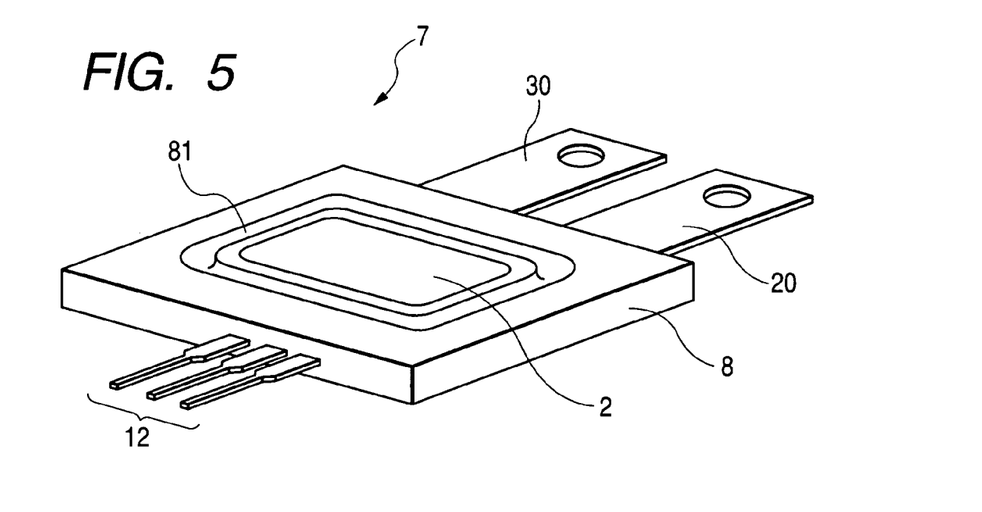
FIG. 5 is a perspective view of a semiconductor module of the second embodiment.
Figure 6:
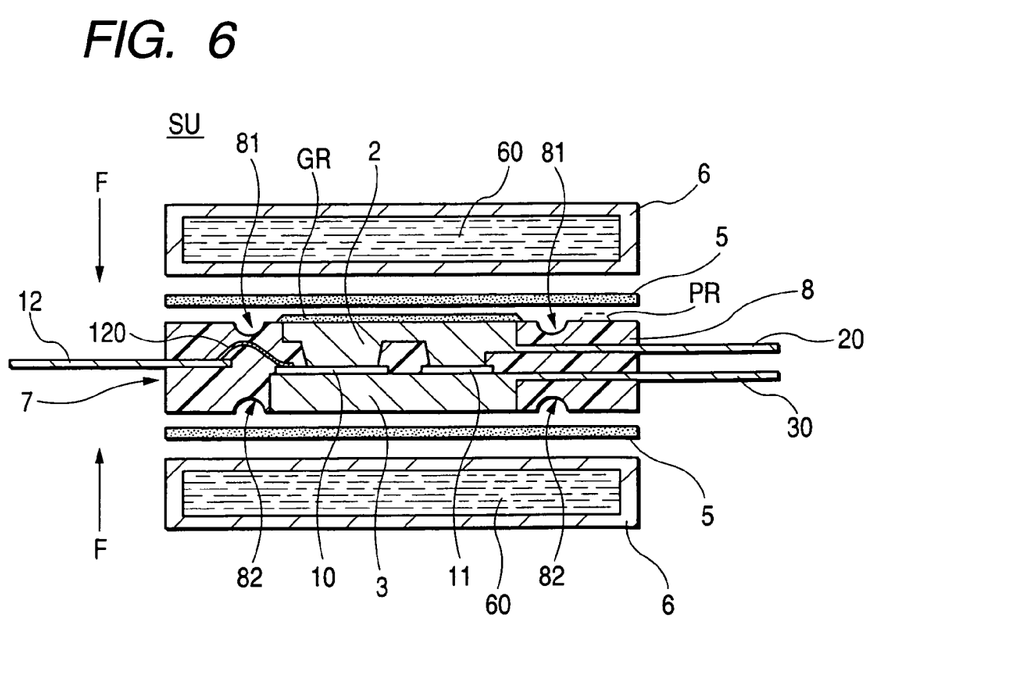
FIG. 6 is a cross sectional view of a semiconductor unit of the second embodiment.

A semiconductor unit SU according to the second embodiment of this invention will be explained below by referring to FIG. 5 and FIG. 6. FIG. 5 is a perspective view of a semiconductor module to be placed in the semiconductor unit SU in the second embodiment, while FIG. 6 shows an exploded cross sectional view of the semiconductor unit SU. In this embodiment, for the sake of a simplified explanation, the identical or similar members to those of the first embodiment are given the same numerals with the first embodiment, thus no explanation thereon being provided.

As shown in FIG. 5 and FIG. 6, the semiconductor unit SU has a semiconductor module 7, insulating members 5, and cooling pipes 6. The semiconductor module 7 includes the first semiconductor device 10, the second semiconductor device 11, an upper electrode plate 2, a lower electrode plate 3, an upper driving electrode terminal 20, a lower driving electrode terminal 30, control electrode terminals 12, bonding wires 120, and a mold resin 8. The semiconductor module 7 has a substantially planar shape as a whole.

The mold resin 8 unifies the first semiconductor device 10, the second semiconductor device 11, the upper electrode plate 2, the lower electrode plate 3, the upper driving electrode terminal 20, the lower driving electrode terminal 30, the control electrode terminals 12, and the bonding wires 120 in a unit. However, an upper face (the first electrode face) of the upper electrode plate 2 and a lower face (the second electrode face) of the lower electrode plate 3 are not covered with the mold resin 8. The mold resin 8 is formed to wholly surround and enclose the semiconductor devices 10 and 11, and the electrode plates 2 and 3. That is, the mold resin 8 is formed on the right, left, front and back sides of the semiconductor devices 10 and 11, and the electrode plates 2 and 3.

An upper resin face (the first resin face) of the mold resin 8 surrounding an exposed face (the first electrode face) of the upper electrode plate 2 is made to be substantially coplanar with the upper exposed face of the upper electrode plate 2 in the fabrication process of the semiconductor module 1. In addition, a lower resin face (the second resin face) of the mold resin 8 surrounding an exposed face (the second electrode face) of the lower electrode plate 3 is made to be substantially coplanar with the lower exposed face of the lower electrode plate 3 in the fabrication process of the semiconductor module 1. An upper planar surface (the first module surface) of the semiconductor module 7 includes the upper exposed face of the upper electrode plate 2 and the upper resin face of the mold resin 8. Similarly, a lower planar surface (the second module surface) of the semiconductor module 7 includes the lower exposed face of the lower electrode plate 3 and the lower resin face of the mold resin 8.

An upper groove 81 (the first groove) surrounding the perimeter of the upper exposed face of the upper electrode plate 2 is formed on the upper resin face of the mold resin 8. To be more precise, the upper groove 81 is formed close to the upper electrode plate 2 on the upper resin face of the mold resin 8. The depth of the upper groove 81 is so configured that the depth becomes deeper than the step formed between the upper exposed face of the upper electrode plate 2 and the upper resin face of the mold resin 8 when the semiconductor devices 10 and 11 generate heat by operation. The cross sectional shape of the upper groove 81 is, as shown in FIG. 6, a substantially circular arc. A lower groove 82 (the second groove) surrounding a perimeter of the lower exposed face of the lower electrode plate 3 is formed on the lower resin face of the mold resin 8. For details, the lower groove 82 is formed close to the lower electrode plate 3 on the lower resin face of the mold resin 8. The depth of the lower groove 82 is configured so that the depth is deeper than the step formed between the lower exposed face of the lower electrode plate 3 and the lower resin face of the mold resin 8 when the semiconductor devices 10 and 11 generate heat by operation. The cross sectional shape of the lower groove 82 is, as shown in FIG. 6, substantially a circular arc.

The insulating members 5 are arranged to face an upper planar surface (the first module surface) and a lower planar surface (the second module surface) respectively of the semiconductor module 7. That is, the semiconductor module 7 is sandwiched by a pair of insulating members 5. A small amount of thermal grease GR (a thermally conductive material) is applied on both of the exposed face of the upper electrode 2 and the lower exposed face of the lower electrode 3. For example, an electrically conductive silver particle paste is used for the thermal grease GR. Generally, a thermal grease GR made of the electrically conductive material such as silver has a higher thermal conductivity than an electrically nonconductive thermal grease, thus providing a higher thermal dissipation performance.

If an electrically conductive grease is used, as described in the above, a short-circuit may result between at least one of the upper and the lower electrode plates 2 and 3, and at least one of the upper driving electrode terminal 20, the lower driving electrode terminal 30, and the control electrode terminals 12. However, if the upper groove 81 and the lower groove 82 are formed, the short-circuit can be prevented. If the insulating members 5 and the cooling pipes 6 are attached after applying the thermal grease GR on the upper exposed face of the upper electrode 2 and the lower exposed face of the lower electrode 3, the thermal grease GR leaks to in the vicinity of both the upper exposed face of the upper electrode 2 and the lower exposed face of the lower electrode 3. The leaked thermal grease GR stays in the grooves 81 and 82, which are formed on the upper resin face and the lower resin face of the mold resin 8, respectively. Therefore, the thermal grease GR does not leak out beyond the upper groove 81 and the lower groove 82. As a result, the short-circuit between the electrode plates 2, 3 and the electrode terminals 20, 30, and 12 is prevented even if the electrically conductive grease is used.

By forming the upper groove 81 and the lower groove 82 close to the upper electrode 2 and the lower electrode 3, that is, forming the grooves 81 and 82 close to the centers of both the upper and the lower surfaces of the semiconductor module 7 respectively, a sufficient distance between the location of the leaked grease and the electrode terminals 20, 30 and 12 is maintained. Thus, a sufficient creepage distance of insulation is secured. As a result, tracking (a gradual formation of a conductive path caused by an application of high voltage) on the surface of the semiconductor module can be prevented.

As described above, the leaked thermal grease GR stays in the upper and lower grooves 81 and 82, and as a result, the thermal grease GR does not leak out beyond the grooves 81 and 82. Therefore, the short-circuit between the electrode plates 2, 3 and the electrode terminals 20, 30, and 12 is prevented even if an electrically conductive grease is used. It is possible in the second embodiment to provide additional advantages as well as the identical or similar advantages to those obtained in the foregoing first embodiment.

A protrusion PR of resin in FIG. 6 has a similar effect to that of the grooves for preventing the leakage of the thermal grease GR and may be used instead of the groove.

(Third Embodiment)

Figure 7:
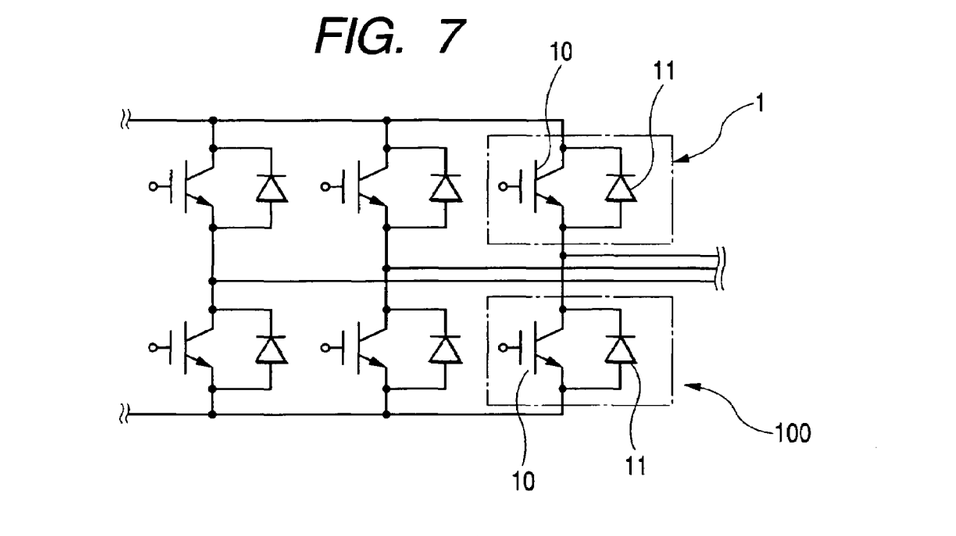
FIG. 7 is a block diagram showing an inverter circuit including a semiconductor module of the first embodiment.
Figure 8:
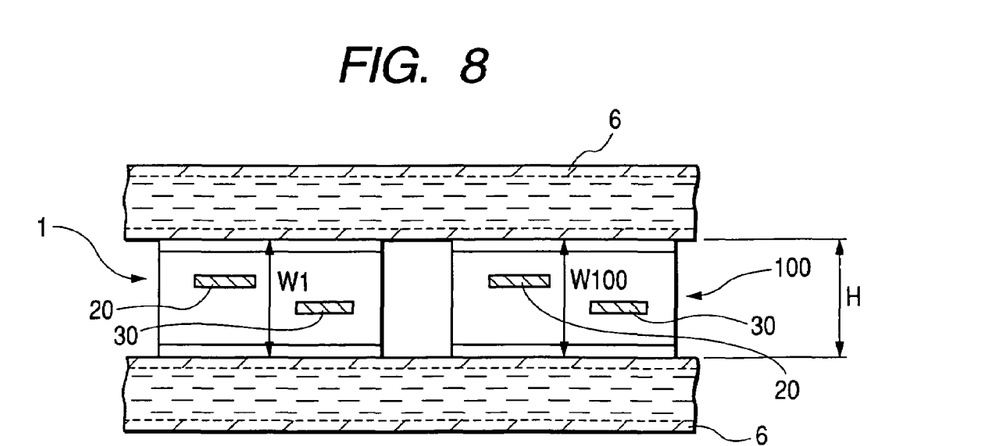
FIG. 8 is a cross sectional view of a semiconductor unit of the third embodiment.

A semiconductor unit SU according to the third embodiment of this invention will be described below by referring to FIG. 7 and FIG. 8. FIG. 7 is a partial schematic of an inverter circuit incorporating semiconductor modules. FIG 8 shows a cross sectional view of the semiconductor unit SU.

The semiconductor unit SU of the third embodiment has two semiconductor modules 1 and 100 which drive the same phase in the inverter circuit shown in FIG. 7. The semiconductor unit SU of the third embodiment includes, as shown in FIG. 7, the semiconductor modules 1 and 100 driving the same phase as described in the above and a pair of cooling pipes 6. The semiconductor module 1 is the same one as in the first embodiment, and the semiconductor module 100 is same as the semiconductor module 1.

Figure 12:
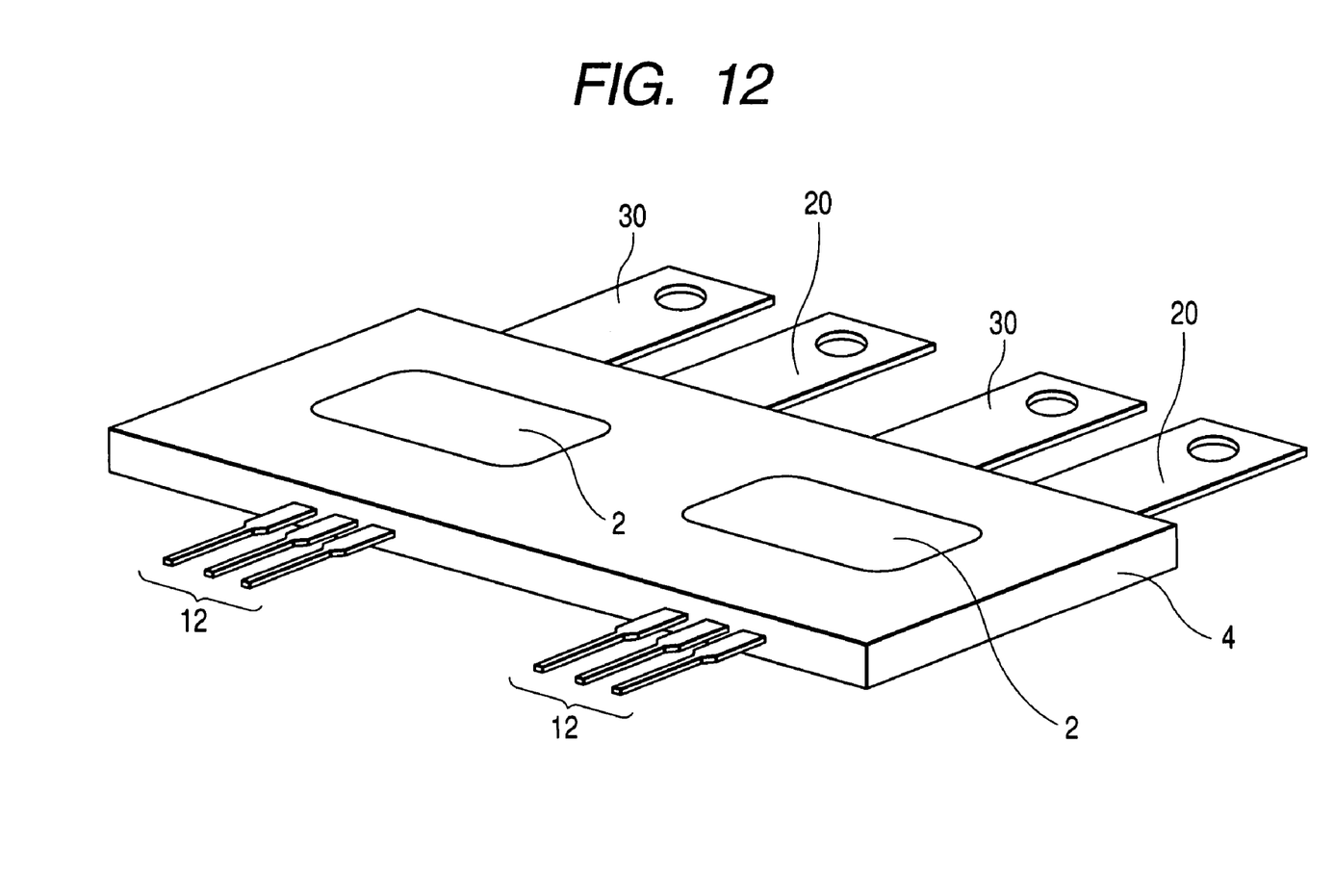
FIG. 12 is a perspective view of a semiconductor module consisting of a plurality of set of the power semiconductor device.

As shown in FIG. 8, thicknesses between upper planar surfaces and lower planar surfaces of the modules 1 and 100, that is, the thickness W1 of the semiconductor module 1 and the a thickness W100 of the semiconductor module 100, are substantially equal. The thicknesses W1 and W100 are also made to be substantially equal to the a clearance H between the two cooling pipes 6. As a result, its vibration resistance is improved by securing sufficient stressing areas of the semiconductor modules 1 and 100, respectively. Also, the cost of the semiconductor unit SU can be reduced because the number of manufacturing steps is reduced since it is not necessary to attach the cooling pipes 6 individually to each semiconductor module 1 and 100. In addition, as shown in FIG. 12, if the semiconductor modules 1 and 100 are unified in a single mold, positioning of each member of the semiconductor unit SU for building thereof becomes easier. The number of semiconductor modules which drive a phase is not limited to two. Three or more modules can be employed depending on the power to be controlled. Even if it is the case, the semiconductor modules can be arranged in the similar manner to the above embodiment in FIG. 8.

It is possible in the third embodiment to provide additional advantages as well as the identical or similar advantages to those obtained in the first and second embodiments.

(Other Modifications)

Figure 9:
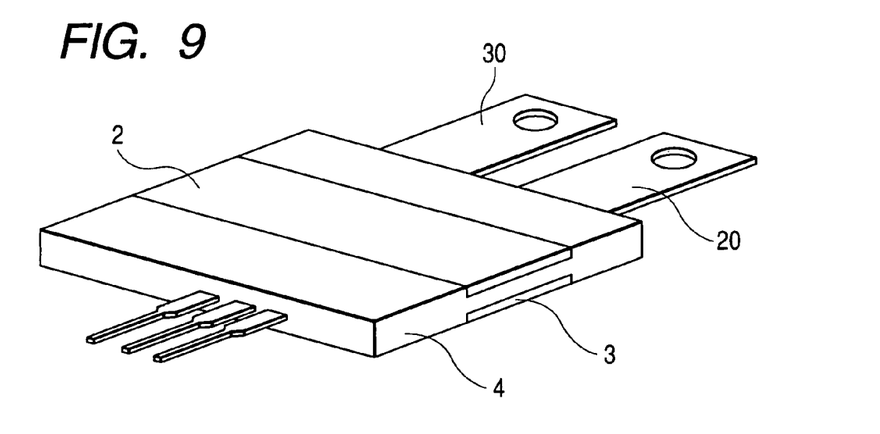
FIG. 9 is a perspective view of a semiconductor module of one of other modifications.

There are provided a variety of modifications of the present invention. The first modification to the present one is regarding the formation of the mold resin. The mold resins 4 and 8 of the semiconductor modules 1 and 7 of the first and the second embodiments are formed to surround and enclose the exposed faces of the upper electrode plate 2 and the lower electrode plate 3. However, the formation of the mold resin is not limited to the manner in the first and the second embodiments. For example, the semiconductor module 1 shown in FIG. 9 can be adopted. FIG. 9 is a perspective view of the semiconductor module 1. As shown, the upper electrode plate 2 and the lower electrode plate 3 are extended in two directions of the semiconductor module 1, that is, in the directions (in FIG. 9) to the top left corner and to the bottom right corner) substantially perpendicular to the directions that the electrode terminals 12, 20 and 30 extend. The electrode plates 2 and 3 have rectangular shapes and span the full width of the semiconductor module 1. In other words, the upper electrode plate 2 and the lower electrode plate 3 have the full width of the semiconductor module 1 in the direction from the top left to the bottom right in FIG. 9 (the direction into the plane of the page in FIG. 2), but occupy only a certain ranges areas around the center of the semiconductor module 1 in the direction from the top right to the bottom left in FIG. 9 (the direction from the left to the right in FIG. 2). Thus, the mold resin 4 is formed only on the left and right ends of the electrode plates 2 and 3 in FIG. 2.

That is, the mold resin 4 of the semiconductor module 1 appears to be divided into two when seen, from the top. In this case, the mold resin 4, which receives the stress described in the above, is still able to secure a sufficient stressing area by means of the two divided resin surfaces. In addition, by increasing the exposed faces of the electrode plates 2 and 3, the thermal dissipation performance of the semiconductor devices can be enhanced. As a result, the reliability of the semiconductor unit SU is improved.

Figure 10:
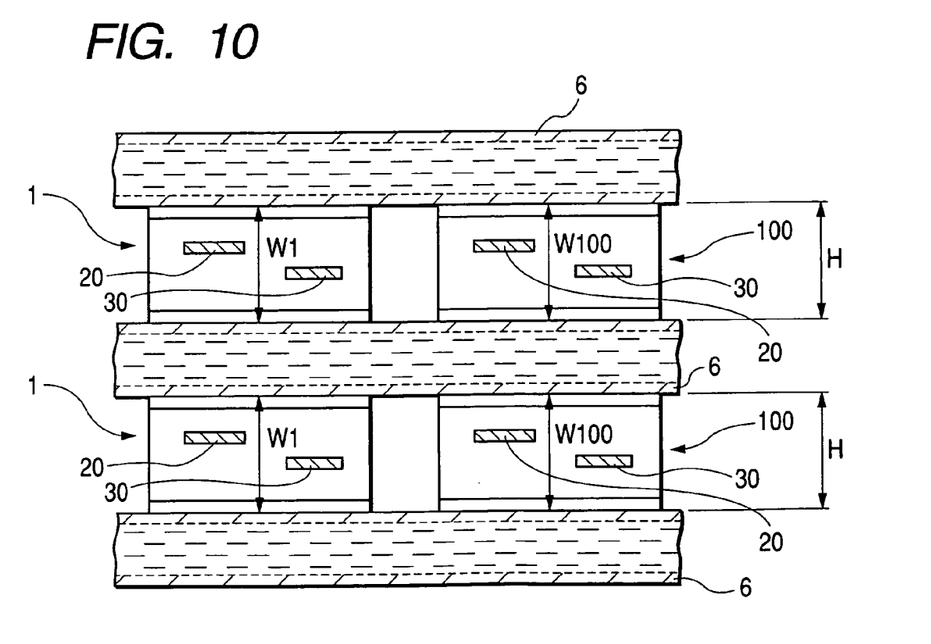
FIG. 10 is a cross sectional view of a semiconductor module of a modification of the third embodiment.

The second modification is on the configuration of stacked semiconductor modules and the cooling pipes. As shown in FIG 2, a semiconductor module 1 is held by a pair of cooling pipes sandwiching the module 1 between the pipes. However, the manner of holding the semiconductor module 1 is not limited to this. For example, as shown in FIG. 10, when an inverter circuit incorporates a plurality of semiconductor modules 1 as shown in the third embodiment, it is possible to stack a cooling pipe 6 and one or more semiconductor modules 1 alternately, layer after layer. In this configuration, the number of components of the semiconductor unit SU can be reduced since both side surfaces of one cooling pipe apply stressing forces to the upper semiconductor module and the lower semiconductor module respectively, resulting in a reduced parts count and manufacturing cost.

The third modification is concerning the insulating member. One example of the alternative to the insulating member 5 may be a thin film directly bonded to the exposed faces of the upper electrode plate 2 and the lower electrode plate 3 of the semiconductor module 1 with a thickness of tens of micrometers. Because the film is much thinner than the insulating member, thereby resulting in an increase in thermal conduction, the reliability of the semiconductor device is improved by better thermal dissipation. In addition, the manufacturing cost of the semiconductor module can be reduced since it is not necessary to assemble the insulating members, and thereby resulting in simplification of the fabrication process of the semiconductor module.

Figure 11:
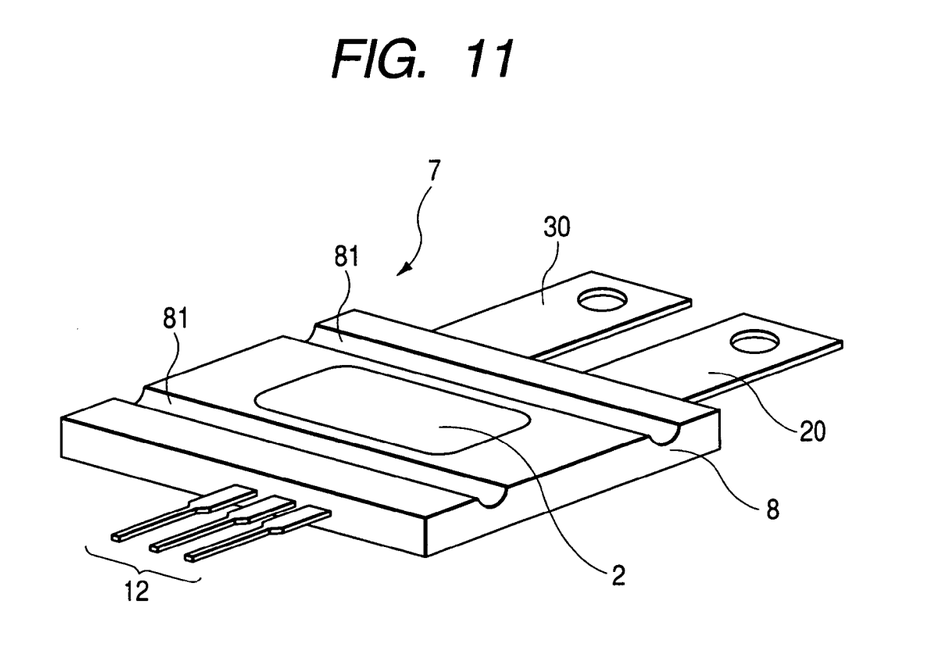
FIG. 11 is a perspective view of a semiconductor module of a modification of the second embodiment.

The fourth modification is regarding the formation of the groove on the mold resin. Both the upper groove 81 and the lower groove 82, which are formed on the mold resin 8 of the semiconductor module 7 in the second embodiment, are formed to surround the whole perimeters of the exposed faces of the upper electrode plate 2 and the lower electrode plate 3. However, the formations of the grooves are not limited to the manner in the second embodiment. For example, as shown in FIG. 11, the upper groove 81 may be formed between the exposed face of the upper electrode plate 2 and the driving terminals 20 and 30, and between the exposed face of the upper electrode plate 2 and the driving terminals 12, respectively. Although not shown, the lower groove 82 may also be formed with the same manner as the upper groove 81, that is, the lower groove 82 may be formed between the exposed face of the lower electrode plate 3 and the driving terminals 20 and 30, and between the exposed face of the lower electrode plate 3 and the driving terminals 12, respectively. The arrangement of the grooves in the above has the same advantages as the second embodiment.

Though not shown, the upper groove 81 and the lower groove 82 may also be formed for the type of semiconductor module shown in FIG. 9. In this case, the upper groove 81 may be formed in a similar manner to that shown in FIG. 11, in which the groove 81 is located between the exposed face of the upper electrode plate 2 and the driving terminals 20 and 30, and between the exposed face of the upper electrode plate 2 and the driving terminals 12. Also, the lower groove 82 may be formed with the similar manner shown in FIG. 11. That is, the grooves 82 may be formed between the exposed face of the lower electrode plate 3 and the driving terminals 20 and 30, and between the exposed face of the lower electrode plate 3 and the driving terminals 12.

The fifth modification is regarding the cross sectional shape of the groove. Shapes of the cross section of the upper groove 81 and the lower groove 82 in the second embodiment are substantially circular arcs. However, the shape is not limited to circular arc. The upper groove 81 and the lower groove 82 may have, for example, rectangular cross section.

The present invention may be embodied in other specific forms without departing from the spirit or essential characteristics of it. The present embodiments are therefore to be considered in all respects as illustrative and not restrictive, the scope of the present invention being indicated by the appended claims rather than by the foregoing description and all changes which come within the meaning and range of equivalency of the claims are therefore intended to be embraced therein. It is possible to implement many other modified, or improved embodiments by skilled people.

What is claimed is:

1. A semiconductor unit comprising:
a semiconductor module including a power semiconductor device, a pair of first and second electrode plates, and a mold resin member unifying the power semiconductor device and the pair of first and second electrode plates, the semiconductor module having first and second module surfaces opposed to each other in the thickness direction of the semiconductor module, each of the first and second module surfaces including an electrode face of each electrode plate and a mold resin face of the mold resin member; and
a cooling member being placed on both sides of the semiconductor module in the thickness direction thereof and configured to cool the semiconductor module,
wherein each electrode face is coplanar with each mold resin face on each of both the sides of the semiconductor module in the thickness direction and the mold resin member is made of a mold resin which has a higher linear expansion coefficient than the electrode plates.

2. A semiconductor unit comprising:
a semiconductor module, which converts a direct current to an alternative current, comprising,
a power semiconductor device, which is substantially flat, having a first device surface and a second device surface on both sides of the power semiconductor device,
a first electrode plate bonded to the first device surface of the power semiconductor device, the first electrode plate having a first electrode face on an opposite side of the bonded surface of the first electrode plate,
a second electrode plate bonded to the second device surface of the power semiconductor device, the second electrode plate having a second electrode face on an opposite side of the bonded surface of the second electrode plate,
a first set of connecting terminals electrically connected to a control circuit and used for controlling the power semiconductor device,
a second set of connecting terminals electrically connected to a driving circuit and used for driving the power semiconductor device, and
a mold resin member formed to unify the power semiconductor device, the first and second electrode plates, and the first and second set of connecting terminals, and to have first and second resin faces on both sides of the mold resin member; and
a cooling member being placed on both sides of the semiconductor module and configured to cool the semiconductor module,
wherein at least one of the first and second electrode faces of the first and second electrode plates is coplanar with at least one of the first and second resin faces of the mold resin member and the mold resin member is made of a mold resin which is higher in linear expansion coefficient than the first and second electrode plates.

3. A semiconductor unit as claimed in claim 2, wherein the first electrode face is coplanar with the first resin face.

4. A semiconductor unit as claimed in claim 2, wherein the second electrode face is coplanar with the second resin face.

5. A semiconductor unit as claimed in claim 2, wherein the first electrode face is coplanar with tie first resin face and the second electrode face is coplanar with the second resin face.

6. A semiconductor unit as claimed in claim 2, wherein the mold resin member is formed to expose both of the first electrode face of the first electrode plate and the second electrode face of the second electrode plate.

7. A semiconductor unit as claimed in claim 1, wherein the mold resin member is formed to expose both of the first electrode face of the first electrode plate and the second electrode face of the second electrode plate.

8. A semiconductor unit as claimed in claim 6, wherein the mold resin member is formed to cause at least one of the first and second resin faces to protrude from at least one of the first and second electrode faces of the first and second electrode plates when the power semiconductor device is in operation.

9. A semiconductor unit as claimed in claim 6, wherein the mold resin member is configured to surround the perimeter of the first electrode face of the first electrode plate and/or the perimeter of the second electrode face of the second electrode plate.

10. A semiconductor unit as claimed in claim 6, further comprising a layer of a thermally conductive material on at least one of the first and second electrode faces of the first and second electrode plates,
wherein a means for preventing the thermally conductive material from flowing out of the one electrode face is provided on at least one of the first and second resin faces of the mold resin member.

11. A semiconductor unit as claimed in claim 10, wherein the preventing means consists of a groove formed, at least partly, on at least one of the first and second resin faces of the mold resin member.

12. A semiconductor unit as claimed in claim 11, wherein the groove is formed at least between one of the electrode faces and the first and second sets of connecting terminals.

13. A semiconductor unit as claimed in claim 12, wherein the groove consists of a plurality of grooves and the one electrode face is located between two of the plurality of grooves.

14. A semiconductor unit as claimed in claim 6, further comprising a layer of a thermally conductive material on both of the first and second electrode faces of the first and second electrode plates,
   wherein a groove for preventing the thermally conductive material from flowing out of each of the first and second electrode faces is provided on each of the first and second resin faces of the mold resin member.

15. A semiconductor unit as claimed in claim 12, wherein the groove is formed to wholly surround the first electrode face of the first electrode plate.

16. A semiconductor unit as claimed in claim 12, wherein the groove is formed to wholly surround the second electrode face of the second electrode plate.

17. A semiconductor unit as claimed in claim 10, wherein the thermally conductive material is electrically conductive.

18. A semiconductor unit as claimed in claim 6, wherein the semiconductor module has first and second module surfaces substantially in parallel to each other, each of the fist and second module surfaces including each of the first and second electrode faces and each of the first and second resin faces.

19. A semiconductor unit as claimed in claim 18, wherein each of a plurality of semiconductor modules having substantially the same thickness, defined as the distance between the first module surface and the second module surface, are sandwiched between the cooling members.

20. A semiconductor unit as claimed in claim 6, wherein the semiconductor module consists of a plurality of set of said power semiconductor device, said first and second electrode plates, and said first and second sets of connecting terminals unified into one module by the mold resin.

21. A semiconductor unit as claimed in claim 20, wherein the plurality of set of said power semiconductor device are incorporated in an inverter to be driven by the same phase.

22. A semiconductor unit as claimed in claim 6, wherein the cooling member is a cooling pipe having one or more paths through which a coolant flows.

23. A semiconductor unit as claimed in claim 6, wherein the cooling member is made of aluminum.

24. A semiconductor unit as claimed in claim 6, wherein the semiconductor module consists of a plurality of semiconductor modules and the cooling member consists of a plurality of cooling members, the plurality of semiconductor modules and the plurality of coolant members being stacked one on another alternately.

* * * * *